United States Patent [19]
Platt et al.

[11] Patent Number: 5,920,131
[45] Date of Patent: Jul. 6, 1999

[54] ARRANGEMENT FOR THE CONTROL OF ELECTRICALLY CONTROLLABLE APPLIANCES

[75] Inventors: Nils Platt, Leonbronn; Wilhelm Perrin, Karlsuhe; Wilfried Schilling, Kraichtal, all of Germany

[73] Assignee: E.G.O. Elektro-Gerätebau GmbH, Germany

[21] Appl. No.: 08/818,822

[22] Filed: Mar. 14, 1997

[30] Foreign Application Priority Data

Mar. 20, 1996 [DE] Germany .......................... 296 05 163
Feb. 17, 1997 [DE] Germany .......................... 197 06 169

[51] Int. Cl.[6] .................................................. H01H 36/00
[52] U.S. Cl. ...................... 307/104; 219/625; 219/663; 307/116
[58] Field of Search .................... 307/104, 116, 307/117, 119; 126/211; 439/38, 39, 40; 341/15; 335/205; 219/648, 661, 457, 507, 508, 622, 625, 633, 662

[56] References Cited

U.S. PATENT DOCUMENTS

| 3,711,672 | 1/1973 | Moreland, II et al. ................ 219/625 |
| 3,852,558 | 12/1974 | McCleerey et al. . |
| 4,233,593 | 11/1980 | Bigelow .................................... 341/15 |
| 4,317,016 | 2/1982 | Ito .......................................... 219/625 |
| 4,812,804 | 3/1989 | Masaki . |
| 4,983,812 | 1/1991 | Worrall et al. . |

FOREIGN PATENT DOCUMENTS

| 409 971 | 1/1991 | European Pat. Off. . |
| 0 497 191 | 8/1992 | European Pat. Off. . |
| 497 191 | 8/1992 | European Pat. Off. . |
| 342 213 | 3/1993 | European Pat. Off. . |
| 0 600 780 | 6/1994 | European Pat. Off. . |
| 600 780 | 1/1997 | European Pat. Off. . |
| 1 122 796 | 1/1962 | Germany . |
| 34 42 583 | 5/1986 | Germany . |
| 35 43 783 | 6/1987 | Germany . |
| 39 08 786 | 8/1989 | Germany . |
| 89 10 606 | 9/1989 | Germany . |
| 38 34 821 | 5/1990 | Germany . |
| 40 19 216 | 3/1991 | Germany . |
| 40 19 217 | 3/1991 | Germany . |
| 43 36 729 | 5/1995 | Germany . |
| 44 32 399 | 3/1996 | Germany . |
| 2 034 043 | 5/1980 | United Kingdom . |

*Primary Examiner*—Richard T. Elms
*Attorney, Agent, or Firm*—Quarles & Brady LLP

[57] ABSTRACT

An arrangement for the control of electrically controllable appliances, particularly electric cookers proposes for each cooking point an operating element magnetically held in contactless manner on the top or front of a plate, e.g. a glass ceramic plate. Below or behind the plate is located a magnet, which magnetically secures the operating element, which can in this position be rotated in contactless manner sensors are operated, which are used for changing the control of the cooking point. Both the control and the fixing of the operating element take place in contactless manner. The plate requires no openings, passages, depressions, etc. The operating elements can be removed on overcoming the magnetic holding force. This removal can be utilized for the complete disconnection of the cooker.

24 Claims, 4 Drawing Sheets

ARRANGEMENT FOR THE CONTROL OF ELECTRICALLY CONTROLLABLE APPLIANCES

The invention relates to an arrangement for the control of electrically controllable appliances, particularly electric cookers.

The object of the invention is preferably used in domestic appliances or cooking point controls as a pick-up for the power control, particularly for the operation of glass ceramic cooking fields or the like, in which one or more cooking points or manual operating members are placed on a body made from magnetically inactive material, such as a glass ceramic plate.

In the case of glass ceramic cooking fields with an integrated control and/or regulation of the cooking points or hotplates the problem arises, as in other appliances, e.g. electrically operated appliances, of favourably positioning the operating members or controls. In the case of a glass ceramic plate passing e.g. in one-piece manner over several cooking points, for the arrangement of said members it must be provided in costly manner with through bores for the switch shafts carrying the members. The glass ceramic plate can also be bent or curved and provided with a laterally bent plate leg, so that the operating members or controls can be laterally positioned. The cleaning of the base plate in the case of such constructions is made much more difficult, particularly due to the projecting controls and/or transmission members, e.g. the switch shafts. The operating control unit, e.g. a control box connected via the transmission member to the operating member, can also be positioned separately from the cooking field or base on a separate socket, so that the operating unit, including the switch or rotary toggle is constructed and positioned separately from the base. The constructional expenditure is always increased.

A method for the control of the operation of a cooker is already known, in which reed switches are placed under a glass ceramic plate and are closable with the aid of a slide having a magnet. The slide is positioned above the glass ceramic plate and is moved along a guide rail (EP 497191). A control switch for a domestic cooker is also known (EP 600780), in which the push button is mounted in rotary manner in a holder on the outside of a plate. The push button contains a magnet, which can activate a solenoid switch located behind the plate.

Furthermore, a control system for an electric cooker is known, in which a control or operating element containing a magnet is positionable at a given point of a glass ceramic plate, in order to open and close a switch positioned below the plate, said element having no guide (EP 342213).

The problem of the invention is to provide an arrangement for the control of electrically controllable appliances, in which the operation is improved and in particular cleaning is facilitated.

The control or operating element is held in exclusively contactfree manner at the point where it is to be operated, so that it can be easily removed for cleaning purposes. The plate, e.g. a glass ceramic plate, has no openings, passages, depressions, fastenings, etc. Simultaneously the determination of the position of the operating member or a change to its position also takes place in contactless manner through the plate. The plate is made from a material allowing the passage of the field lines in a virtually unattenuated manner. The operating element can e.g. engage on the top or front of the plate and a special design of the directly engaging part can contribute to a frictionless or low-friction movement. A frictionless retention of the operating element is here understood to mean that it can be held without any direct mechanical connection. Naturally the operating element can be in contact with the plate. However, it is not mechanically fixed either to the plate or to the field generating device. The nature of the movement of the operating element can be in accordance with the particular requirements.

The invention proposes the use of a switch toggle, which is positionally secured by field forces and/or through an e.g. inner signal line or conductor, such as a glass fiber cable or the like, is suitable as an intermediate mediate member for a rotation position or other information transmission. The line is fixed in the toggle, so that it forms a bridge with an input and an output. In order to increase the operational reliability, several such transmission or information bridges can be used in the switch or toggle.

The input of the glass fiber cable or strand-like signal or light line is subject to the action of a signal or light wave, whose signal is received in contactless manner by at least one signal sensor, such as a photocell and is supplied e.g. to an electronic evaluating unit, where it is so converted that the power setting unit is set as a function of the toggle position to different operating stages or states.

For a possible coding the light source can already be modulated and/or provided with one or more patterns. Similar effects can be brought about by magnetically acting sensors in the switch or toggle, corresponding additional subassemblies being provided. In the case of multiple bridges in the switch or toggle due to the patterns present additional pattern asequences can be used for release purposes.

The rotary control or toggle can admittedly be centered by positive engagement against lateral displacement, e.g. in a blind hole-like centering opening in the body, but is appropriately axially secured on the said body by holding forces, such as magnetic forces, acting in contact-free manner so as to prevent raising.

According to a further development of the invention, the device for fixing the position and/or modifying the position of the operating element has at least one sensor, which is positioned on the same side of the plate as the device for generating the field of force. In an electric cooker with a glass ceramic plate this is formed by the bottom of the plate. The sensor is so positioned that the operating element can interact therewith. The sensor can be a more complicated structure, e.g. a light source and a photocell, so that a reflection of light on the operating element can be used for determining its position.

According to the invention, the sensor can be influenced by the same physical phenomenon, which is also used for securing the operating element, e.g. a magnetic field.

According to a further development of the invention, the sensor is directly influenceable by the field used for securing the operating element.

However, it is also possible for the sensor to respond to a different physical quantity than that used for securing the operating element. For example, the operating element can be magnetically secured, whereas the sensor responds to an inductance, capacitance or reflection change.

According to a further development of the invention, the operating element can be secured in such a way that it is movable with only one degree of freedom. The concept of mobility with one degree of freedom is understood to mean that the operating element can be moved in order to carry out a control of the electrical appliance. It can e.g. be a displacement or in particular a rotation about a fixed axis.

According to a further development of the invention, for the movement of the operating element a grid system is provided, which also functions in contactless manner. As a result of the grid system, the user of such an arrangement receives a perceptible information feedback to the effect that the operating element has in fact been adjusted. Thus, during operation, the user is given the sensation normally existing with electric cookers.

According to another development of the invention, an incremental pick-up is connected to the sensor and establishes how greatly or far the operating element is moved. Thus, a varying change to the control is brought about by a varying adjustment of the operating element. Such a possibility is very advantageous in a contactless retention of the operating element and in the case of adjustment by rotation, because there is no mechanical zero or end position of the operating element.

However, the invention also provides the possibility of an absolute pick-up, in which the actual position of the operating element is determined. Such a possibility in particular exists with those operating elements, which can be moved along a line.

According to the invention, the at least one sensor can be connected to an evaluation logic, which is e.g. used for distinguishing a rotation to the right from a rotation to the left, so that an upward and downwards adjustment of a power setting is possible.

According to a further development, the arrangement can also have an automatic disconnecting device, which, if all the operating elements are set to zero, leads to a complete switching off of the appliance, so that a different process must be used for switching on again.

According to the invention, the arrangement can be switched off and switched on again by a master switch. The master switch can also be operated by the operating element, which can then be easily brought to another point on the plate.

According to the invention, the device for generating a force field has at least one fixed magnet and the operating element has a member cooperating therewith made from ferromagnetic material, the arrangement of the magnet defining the degree of freedom of the movement. The ferromagnetic material member located on the operating element can e.g. be a soft iron, which is attracted by the magnet, but can also be a magnet.

According to a further development of the invention, a single magnet is so positioned on the underside of the plate that its magnetic axis is perpendicular to the plate. This magnetic axis can then form a rotation axis for the operating element, which is kept centered with respect to this axis and can then be rotated about said axis.

According to a further development, to the magnet is fitted a sheet metal part made from ferromagnetic material having at least two arms, which approach the plate in the end region thereof. This can lead to the formation of a second, closed magnetic circuit, which focusses the field lines to a particular point. Thus, a magnetic pole is shunted, which is in this case fixed and can bring about a locking or catching in conjunction with the operating element.

It is also possible for the device for generating a field to have a movable magnet and the operating element has a ferromagnetic material component cooperating therewith, the retention for the magnet defining the degree of freedom of the movement of the operating element. If e.g. the magnet can be slid under a glass ceramic plate, this sliding can be brought about by the movement of the operating element.

In particular, with the movable magnet can be moved a component, whose movement is detected by sensors. The sensor does not directly detect the position and/or position change of the operating element, but instead does this indirectly via a change to the position of a second component brought about by the movement of the operating element.

In particular, the magnet can be rotatably held about a fixed axis on the underside of the plate. It is thus possible to rotate therewith e.g. a disk carrying a coding. In this case, it is appropriate for the magnetic axis of the magnet to be parallel to the plate and for the operating element also to have a magnet, whose axis is also parallel to the plate. The two magnets are then antiparallel to one another and remain in this form when the operating element is rotated.

According to another development of the invention, the magnet is so movably held, that by interaction with the operating element it is brought into its operating position and after removing the operating element can be moved into a waiting position. For example, the magnet on the underside of a glass ceramic plate can be swung downwards about a horizontal axis, if the operating element is removed from the top of the glass ceramic plate. When the operating element is moved back into the correct position, the magnet swings back again.

This movement of the magnet on the underside of the plate can be utilized for operating a switch, which brings about a galvanic line isolation.

Further features, details and advantages of the invention can be gathered from the claims, whose wording is made by reference into part of the content of the description, the following description of preferred embodiments of the invention and the attached drawings, wherein show:

Figure 1:
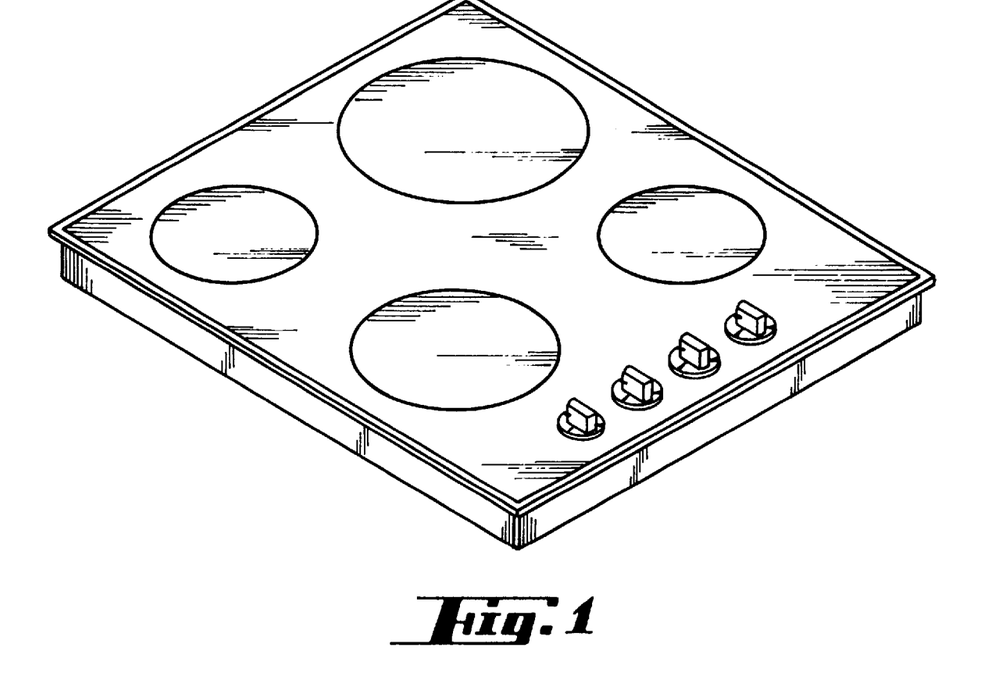
FIG. 1 A glass ceramic cooking field in a perspective overall view.
Figure 2:
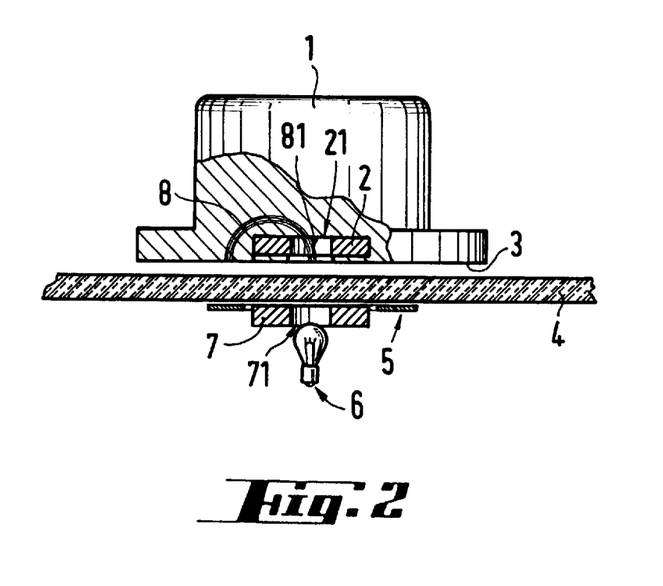
FIG. 2 A switch toggle arrangement of the appliance according to FIG. 1 in a larger scale, part sectional side view.

According to FIGS. 1 and 2 the cooking field has as the body a glass ceramic plate 4 surrounded by a separate frame having one or more spaced cooking points or hotplates. The heaters, e.g. radiant heaters, for the cooking points are located on the back or bottom of the plate and deliver their heat radiation through the plate to the front or top thereof on which can be placed cooking utensils. On the top of the through planar or constantly thick plate are juxtaposed or adjacently positioned several operating members 1, with which the individual heating means can be manually controlled independently of one another, e.g. switched on and off, as well as being set in substantially continuous manner to different operating powers. The operating members 1 are positioned between the cooking fields and an outer edge of the plate directly adjacent and in a row parallel to said outer edge. The operating members 1 are arranged in spaced, juxtaposed manner and their lower end faces can engage on the top of the plate.

In order to provide a correct design and functional solution for obtaining the inventive effects, the operating member 1 is constituted by the plastic toggle 1 normally used in such appliances, which has on the outside of a circular disk a gripping bar or web for gripping with the fingers of one hand and the disk inside 3 is parallel to the plate 4 and engages on the top thereof. The gripping web and circular disk are constructed in one piece.

In the centre or rotation axis and in the vicinity of the inner end face 3 of the toggle 1 is provided an e.g. circular, interrupted, magnetizable disk 2 of ferromagnetic material. Through a signal window or opening 21 in the centre of said disk 2 a signal conductor or line 8 or glass fiber cable is embedded in the toggle 1 and can be firmly embedded substantially completely in the material of the toggle 1. Both ends of the glass fiber strand 8 having constant cross-sections are terminated flush with the terminal bearing side 3 or end face of the toggle 1, one end 81 of the thus formed signal bridge 8 being located centrally or in the axis of the toggle 1. Between its two ends the signal line 8 is curved in an approximately semicircular manner, so that the two end faces of the bridge 8 can be located in a common plane, but at the outer circumference both are encased by the material of the toggle 1. In the area in which the signal line 8 traverses the circular disk-like member 2, it need not be embedded in the material of the toggle 1.

The member 2, which is slightly set back with respect to the end face 3, is tightly embedded completely in the material of the toggle 1 and is covered on all sides by said material. On the side facing the plate 4 said material forms a thin covering of the associated end face of the member 2, said covering also covering and closing the opening 81, but is traversed by the associated end 81 of the signal line 8. The end face 3 over its entire extension and the extremely thin covering can be formed in continuous planar manner or, to reduce friction with respect to the plate 4, solely by individual studs or webs.

Below the plate 4 or on its inside remote from the toggle 1 is provided a disk-like or circular magnet 7, optionally fitted directly to the plate 4. Radially adjacent to or around the magnet 7 are provided in a ring around the rotation axis of the toggle 2 photocells 5, which can also be fixed directly to the plate 4. Below the same is located a light source 6, which can be positionally secured directly to the plate 4, radiates through the central opening 71 of the member 7 and can be shielded with respect to the elements 5. The two members 2, 7 can have the same inside and/or outside width or thickness and can be made from the same material, being positioned coaxially to one another.

One end of the signal line 8 forms the signal input and the other end face the signal output. Appropriately the end face in the rotation axis serves as the signal input, so that the light source 6 is also located in the same axis and can radiate against the signal input in any rotation position of the toggle 1.

The signal, namely light, is transmitted by the light source 6 through the opening 71, then through the plate 4 and finally into the signal input, from which it passes along the bridge 8 to the signal output and is directed there in opposition to the signal input, but once again parallel to the rotation axis. From the signal output the light returns through the plate 4 to the sensor ring 5, whose radial spacing from the rotation axis can be the same as that between the signal input and signal output. As a function of the rotation position, the light strokes a different photoelectric cell 5.

The thus transmitted signal is then supplied to a not shown evaluating circuit and is converted by the latter for the control of the associated setting unit.

In the area covered by the toggle 1 or the control arrangement 5, 6, 7, 71, the plate 4 is free from openings, because no transmission member or switch shaft is required for the signal transmission. For positionally securing the toggle 1 relative to the plate 4 there are appropriately field forces, such as magnetic forces. These forces can secure the toggle 1 axially against raising and/or radially against lateral displacement, but appropriately for radial securing or centering there are members which engage in one another or slide on one another.

The retaining of the toggle 1, which can be constructed separately from the members for signal transmission, is here located in the vicinity thereof and is namely formed by the members 2, 7. The magnet 7 located under the plate 4 supplies so much force that the toggle 1 at the top as a result of the retaining member 2 completely surrounded or embedded therein is fixed in its axial or radial position, but is still mounted in rotary manner with respect to the parts 4, 5 and 6. Nevertheless the toggle 1 can be raised manually and without a tool by applying a correspondingly high force out of its operating position and axially from the switch shield or plate 4 or can be displaced from its centered position with respect to the ring arrangement 5, 7 radially along the plate 4 out of the field of force of the magnet 7.

When using the construction according to the invention for a cooking point control the important advantage is obtained that, as in the case of touch contact switches, no openings are required in the glass ceramic surface or plate 4. The toggle 1 e.g. provided with several bridges 8 around the rotation axis will select by means of the pattern coding the power stages by means of the sensors 5, a pattern being associated with each bridge 8.

Through the simple removal of the toggle 1 from the operating position, it is possible to secure against unauthorized operation by children or the like. If all the toggles 1 are removed from the glass ceramic surface, the plate 4 forms a working plate widened or enlarged around the operating field of the toggles 1 within a larger overall plate receiving the plate 4, without the enlarged working surface being impeded by the toggles 1. The cleaning of the glass ceramic surface is also greatly simplified by the removal of the toggles 1.

To prevent lateral movement along the plate, the operating member 1 can be positively secured, e.g. in that a centering member is fixed by adhesion or bonding to the top of the plate 4. This securing or centering member, e.g. a plastic cone, can be located in the rotation axis and consequently completely covered by the operating member 1. The centering member appropriately slides into a complimentary opening of the operating member 1, which traverses the end face 3 and can be bounded by the member 2. Appropriately the securing member is centrally provided with an opening for the optical path between the light source 6 and the signal input 81. The security member can be so positioned that it keeps the end face 3 at a limited distance from the plate 4 and therefore keeps the operating member 1 contactless with respect to the plate 4.

The securing member can also serve to prevent axial raising of the operating member 1, e.g. by means of a resilient snap connection, which allows a free rotatability of the operating member 1, but which is only released on raising the operating member 1 if a correspondingly high raising force is exerted. This axial securing can be provided in place of or in addition to the magnetic securing, the retaining member 7 also being locatable on the securing member and is then spaced from the member 2, said spacing being smaller than the thickness of the plate 4.

Figure 3:
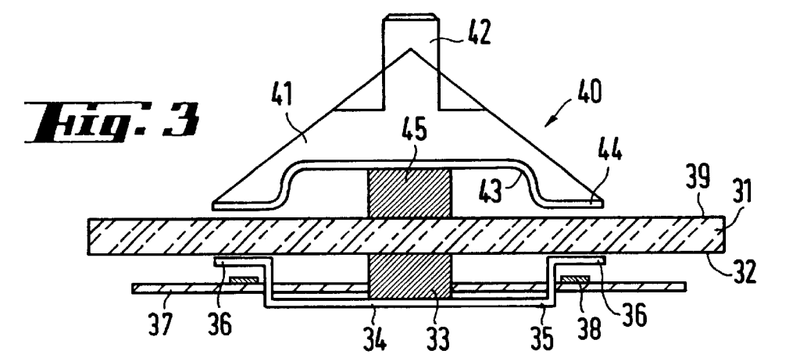
FIG. 3 A diagrammatic representation of a rotatable operating element for a glass ceramic plate.

FIG. 3 shows a cross-section through a glass ceramic plate 31, which e.g. passes in the case of a cooker horizontally and is used for receiving cooking utensils. A magnet 33 is fitted to one point of the underside 32 of the plate by means of a mounting or fastening, which is not shown. The magnet 33 engages on the underside 32. Its magnetic axis, i.e. the connecting line between its north pole and its south pole is perpendicular to the underside 32 of the glass ceramic plate 31. On the end face remote from the plate 31 a sheet metal part 34 having several arms 35, which extend radially outwards, is fitted to the magnet 33. In their end regions the arms 35 approach the plate 31 and form there several magnetic poles 36.

Between the sheet metal part 34 and the plate 31 is fitted a mounting plate 37 which, like the magnet 33 and part 34, is kept fixed. On the lateral face facing the plate 31 several sensors 38, which are only diagrammatically illustrated, are fitted to the mounting plate 37. The top 39 of the plate 1 is constructed in the vicinity of the magnet 33 in the same way as in the remaining area, i.e. has no depression, opening or other special construction.

On the top 39 is placed an operating or control element 40, which has a disklike part 41 with a gripping lug 42. The disk part 41 is bounded on its underside by a sheet metal part 43, whose shape and dimensions roughly correspond to the sheet metal part 34 on the underside of the plate 31. Here again the ends 44 of arms of the sheet metal part approach the plate 31. On the underside of the disk part 41, below the sheet metal part 43, is fitted a ferromagnetic material element 45, in particular also a magnet, whose shape and size correspond to the magnet 33. The magnet is also so oriented that its magnetic axis is perpendicular to the bearing surface formed by one end face of the magnet 45. The orientation of the magnet 45 is precisely the same as that of the magnet 33 on the underside of the plate 31, so that the north pole of the lower magnet 33 attracts the south pole of the upper magnet 45. As a result of this attraction, the upper magnet 45 and therefore the complete operating element 40 is centered with respect to the lower magnet 33. With the aid of the gripping lug 42 the operating element 40 can be rotated about the magnetic axis of the lower magnet 33. The centering is maintained, even if an operator attempts to move sideways the said grip. Only when a greater lateral force is applied, can the operating element be moved away from the location of the magnet 33.

On rotating the operating element 40, the poles formed by the ends 44 of the arms of the sheet metal part 43 are displaced with respect to the sensors 38, so that with the aid of the latter it is possible to detect a change to the rotary position of the operating element 40.

Figure 4:
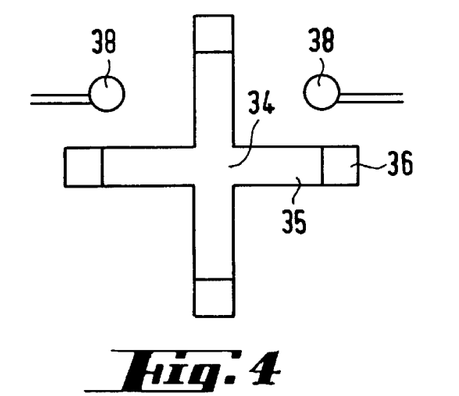
FIG. 4 A diagrammatic plan view of the arrangement of FIG. 1, to the extent that it is located below the plate.

So that not only a change to the rotary position of the operating element 40 can be detected, but also the rotation direction in which this change has taken place, as shown in FIG. 4, there are two such sensors 38, which are so displaced along the circumference about the magnetic axis that they do not simultaneously cooperate with the ends 44 of the arms of the sheet metal part 43.

The plan view of FIG. 4 also shows the lower sheet metal part 34 without the magnet 33, with the arms 35 and magnetic poles formed by the ends 36 of said arms 35. If the upper sheet metal part 43 has the same number of arms with magnetic poles, then the magnetic poles 36, 44 are always mutually attracted if positioned at the same circumferential point. Thus, in the represented embodiment the operating element has four stable rotation positions. This forms a contactless operating locking of the operating element 40, which is perceived by the user on rotation. In order to intensify this action, additional magnets can be fitted to the ends of the arms of one or both sheet metal parts.

With the aid of arrangement of two sensors 38 in the described manner, it is also possible to establish in which direction and by what amount the operating element 40 has been rotated. With the aid of an evaluating circuit, it is possible in this way to change the power setting of a hotplate.

Figure 5:
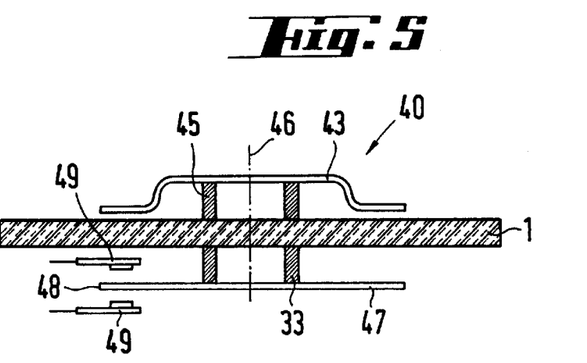
FIG. 5 A representation of a second embodiment corresponding to FIG. 3.

Whereas in the embodiment according to FIG. 3 the magnet 33 on the underside of the plate 31 is fixed and unrotatable, in the embodiment of FIG. 5 on the underside of the plate 31 a magnet 33 is mounted so as to rotate about a fixed axis 46. Details of the rotary mounting are not shown. A disk 47 is connected in non-rotary manner to the side of the magnet 33 remote from the plate 31 and is also rotated on rotating the magnet 33. In the vicinity of the circumference 48 of the disk 47 there are two sensors 49, whereof one is positioned above the disk 47 and the other below the disk 47. The two sensors 49 can detect a change to the rotary position of the disk 47 and optionally also the absolute position of said disk 47.

On the top of the plate 31 is located a control or operating element 40, which has a similar construction to the element 40 of the embodiment according to FIG. 3, but which has below the sheet metal part 43 a magnet 45, whose magnetic axis is oriented parallel to the surface of the plate 31. The magnetic axis of the magnet 33 located below the plate 31 is also parallel to said plate 31. The upper magnet 45 is antiparallel to the magnet 33 on the underside and remains in this position. If the operating element 40 is rotated about the axis 46, the magnet 33 and therefore the disk 47 rotate therewith. Therefore the sensors 49 can indirectly establish the change to the rotary position of the operating element 40 by detecting the rotary position of the disk 47.

Figure 6:
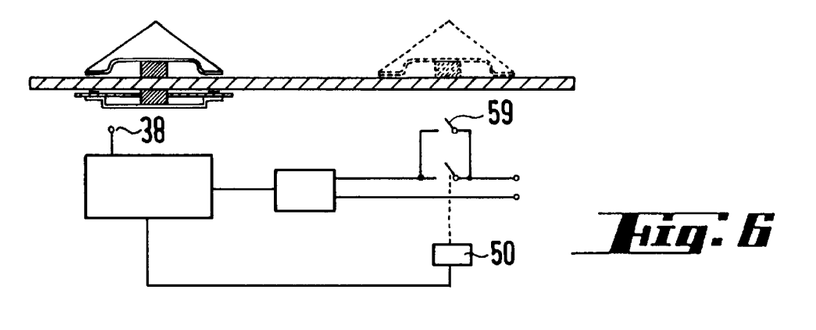
FIG. 6 A representation with a disconnection.

FIG. 6 shows a separate switching on device, which can be activated with the operating element. The electronics are supplied with power by the mains voltage. In the lead is provided a switch controllable by a latching relay 50 and in parallel to said switch is connected a reed contact. If all the power consuming means are disconnected, after a short time the latching relay opens. Then a movement of the operating element or elements at their allocated positions cannot reconnect the power supply. If the device is to be switched on again, it is necessary to move an operating element via the reed contact, so that it is closed and the electronics are supplied with power. This then leads to the control of the latching relay, so that now a rotation of the operating elements at the associated locations leads to a switching on of the appliance.

This device permits an automatic disconnection means, which, if e.g. all the hotplates of a cooker are switched off, disconnects the complete electronics after a certain time.

Figure 7:
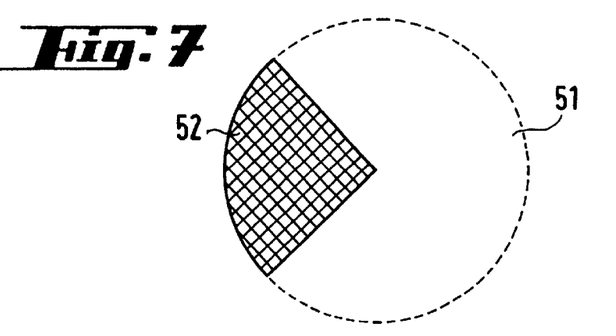
FIG. 7 A plan view of part of an operating element in a modified embodiment.
Figure 8:
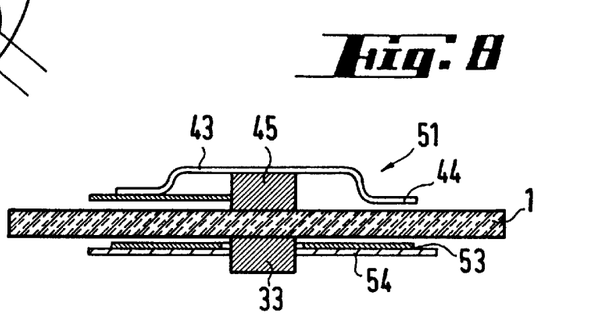
FIG. 8 A representation of the embodiment of FIG. 7 corresponding to FIG. 5.
Figure 9:
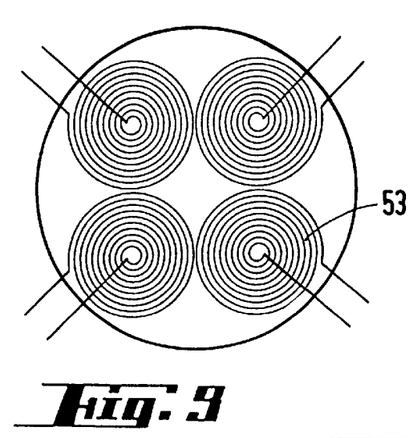
FIG. 9 A plan view of the sensors for the embodiment of FIG. 8.

Whereas in the embodiment according to FIG. 3 the discreet magnetic poles 44 rotated with the operating element 40 lead to a control of the sensors 38, with the operating element 51 of FIGS. 7 and 8 there is a sector 52 of a metallic material, which is rotated against several coils 53 located on the bottom of the plate 31. If the sector 42 is rotated via a given coil 53, then its inductance changes. In this way the absolute position of the operating element 51 can be determined. As a function of the number of coils 53, a more or less precise determination of the absolute angular position of the operating element 51 can be obtained. In the embodiment according to FIGS. 7 to 9 the coils 53 are fitted as sensor means to a plate 54, which is kept fixed. For centering and fixing the operating element there are once again a magnet 33 on the underside and an upper magnet 45 associated with the operating element and whose underside simultaneously forms the bearing surface. Once again the ends 44 of arms of the sheet metal part 43 can be used to bring about a locking of the operating element 51 with magnetic poles 36 positioned below the plate 31.

In the embodiments magnetically or optically operating sensors are shown. However, it is obviously possible to use other sensors for determining a change to the position of the operating element.

Figure 10:
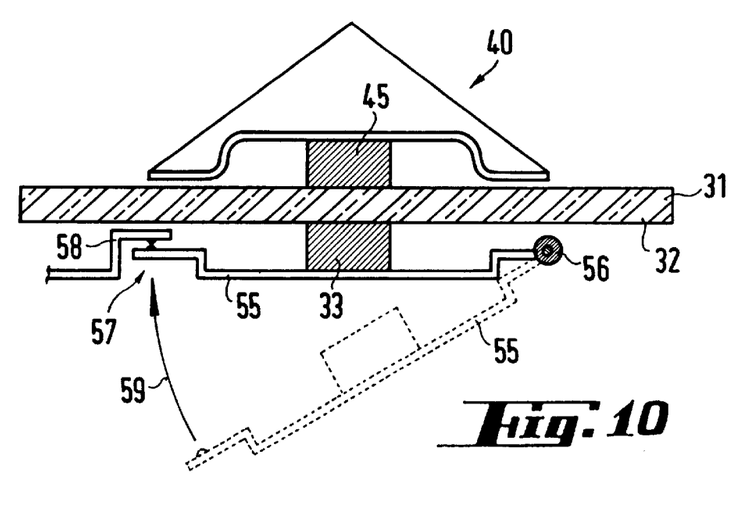
FIG. 10 A view of an embodiment corresponding to FIG. 3, in which the magnet can be swung away below the plate.

FIG. 10 shows an embodiment similar to that of FIG. 3. The magnet 33 located on the bottom 32 of the plate 31 is fixed to a mounting element 55, which is pivotably articulated laterally to a horizontal spindle 56. The mounting or retaining element 55 can e.g. be made from metal and forms part of a switch 57. The second contact 58 is fixed. If the mounting element 55 is pivoted downwards, the switch 57 opens. If the operating element 40 is now moved over the point where the magnet 33 is located, the latter is attracted by the upper magnet 45. Therefore the mounting element 55 swings upwards in the direction of the arrow 59 and consequently closes the switch 57. Thus, a galvanic isolation can be brought about by moving away the operating element 40. This also fulfils the requirement according to which in the isolated state the spacing between the switch contacts should have a certain minimum value of e.g. 3 mm. Obviously a galvanic isolation can also be implemented by a reed switch.

Figure 11:
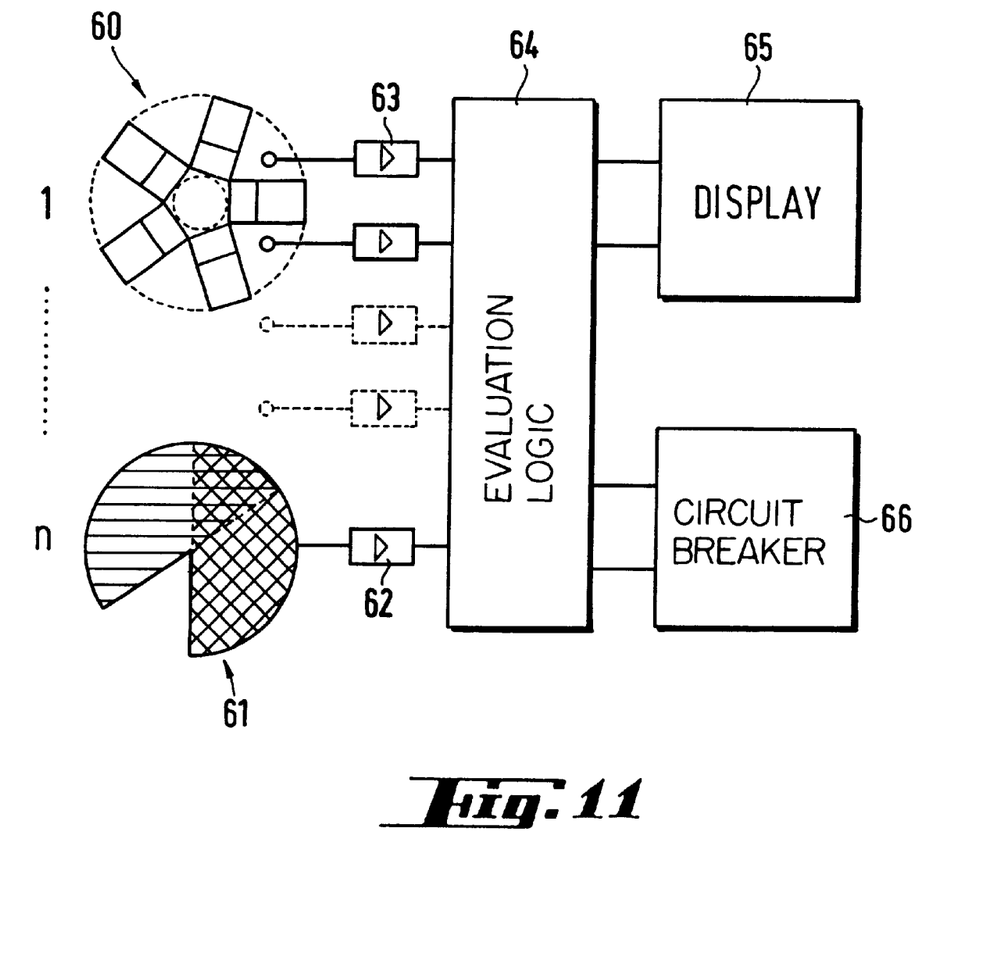
FIG. 11 Diagrammatically the connection between the operating element, sensor and evaluation electronics.

FIG. 11 diagrammatically shows the arrangement of several controls for an electrical appliance, e.g. a cooker. For the control of a first hotplate is e.g. provided the control arrangement 60, whilst a second control arrangement 61 is used for the second hotplate. The control arrangement 60 can be constructed in the same way as in the embodiment of FIG. 3, whereas the control arrangement 61 is formed by a type of variable capacitor. Obviously, in a specific electrical appliance type, different control types will not be combined. It is merely intended to show here that different control arrangements can be used for controlling an appliance. The controls are connected across measuring amplifiers 62 or pulse shapers 63 to an evaluating logic 64, which controls both displays 65 and circuit breakers 66. An individual circuit breaker 66 is provided for each hotplate. The display 65 is used for displaying settings of hotplates, optionally also for displaying residual heat.

The aforementioned locking, which is magnetically produced, leads to the rotary operating element remaining in a clearly defined position after release. The operating element can be constructed with a central magnet and be provided with a sheet metal part having at least two arms. It is also possible to provide additional magnets at the ends of the arms of the sheet metal part.

The invention proposes manufacturing the operating element as a permanent magnetic material moulding and whose at least two arms have a polarity antithetic to the centre.

The magnetic field changes occurring on rotating the operating element can be used for controlling sensors responding thereto. These sensors can be Hall sensors, coils, magnetoresistive sensors or reed contacts. The position of the operating element can also be determined by capacitive, optical, inductive or electromagnetic waves.

The evaluation logic is so constructed that by rotating the operating element there is no drop below or rise above a minimum and/or maximum value.

If the operating element is moved laterally out of the range of the action of the magnets positioned below it, then the complete control of the electrical appliance is disconnected. When using several operating elements for controlling a cooking field or several hotplates only the hot point for which the operating element has been removed must be disconnected.

If all the operating elements are connected to zero, then at the end of a predetermined time interval there is a complete disconnection of the device. No further connection can be brought about by rotating a control element. Instead it is necessary to laterally extract from the operating position at least one operating element for a certain period of time and then return it to the operating position.

We claim:

1. Arrangement for the control of electrically controllable appliances, comprising:
    a platelike element;
    a device for genetating a field acting as force field placed on a first side of the platelike element;
    an operating element located on the opposite side of the platelike element and being movable between a plurality of positions; and,
    a device for determining the position and the position change of the operating element, which cooperates exclusively in contactfree manner with the operating element, the operating element being kept fixed on the plate exclusively by the force of the field, and said device for determining the position and position change of the operating element having at least one sensor located on said first side and said sensor being influenced by said operating element exclusively in a contactless manner.

2. Arrangement according to claim 1, wherein a contactless signal transmission is provided for operational control, as a function of the particular setting position of the operating member.

3. Arrangement according to claim 2, wherein the signal transmission contains at least one signal line in the operating member which with the exception of signal input and a signal output, is completely and tightly embedded in the operating member and forms at least one signal transmission bridge between a signal generator and at least one signal receiver.

4. Arrangement according to claim 3, wherein said signal line is a strand-like light guide.

5. Arrangement according to claim 2, wherein in the case of several signal transmission bridges within, the operating member with each bridge is associated a pattern, which corresponding to a pattern coding selects the operating states, such as power stages.

6. Arrangement according to claim 2, wherein a signal line is made from glass fiber material having ends positioned approximately axially parallel in the same plane as the rear end base of the operating member.

7. Arrangement according to claim 1, wherein the operating member contains several adjustably or rotatably mounted toggle parts, whereof a toggle socket directly supported on a body in the case of toggle operation is fixed relative to said body and the other, mounted toggle unit is provided as an operating member for manual adjustment with respect to the socket and the body and the signal line is located on the operating member and a signal transmission traverses the toggle socket.

8. Arrangement according to claim 1, wherein the operating member is positively secured against lateral displacement by a securing member fixed to a body, and which engages in a complimentary matching, central funnel shape on a toggle underside.

9. Arrangement according to claim 1, wherein the operating member is positively secured against lateral displacement by a securing member fixed to a body, and which engages in a complimentary matching, central funnel shape on a toggle underside.

10. Arrangement according to claim 1, wherein the sensor can be influenced by the same physical phenomenon as used for securing the operating element, namely the field used for securing the operating element.

11. Arrangement according to claim 1, wherein the sensor responds to a different physical phenomenon from that used for securing the operating element.

12. Arrangement according to claim 1, wherein the operating element is so secured that it is movable in one degree of freedom.

13. Arrangement according to claim 1, wherein there is a contactless-operating grid system for the movement of the operating element.

14. Arrangement according to claim 1, wherein an incremental pick-up is used for the movement of the operating element.

15. Arrangement according to claim 1, wherein an absolute pick-up is provided for the movement of the operating element.

16. Arrangement according to claim 1, further comprising an evaluating logic connected to a pulse shaper for receiving data from said operating element.

17. Arrangement according to claim 1, wherein the device for generating a force field has at least one magnet kept fixed and the operating element has a ferromagnetic material member cooperating therewith, the arrangement of the magnet defining the degree of freedom of the movement of the operating element.

18. Arrangement according to claim 1, wherein the field generating device is a magnet and a ferromagnetic material sheet metal part is fitted to the magnet, the sheet metal part having at least two arms, whose end region approaches the platelike element and further comprising a second magnet, whose magnetic axis is perpendicular to the platelike element and forms a rotation axis for the operating element.

19. Arrangement according to claim 1, wherein the device for generating a field has a movably and rotatably mounted magnet and the operating element has a ferromagnetic material component cooperating therewith, the holding for the magnet defining the degree of freedom of the movement of the operating element.

20. Arrangement according to claim 19, wherein with the magnet is movable a component, whose movement is detected by the sensor.

21. Arrangement according to claim 1, wherein the operating element has a ferromagnetic material sheet metal part having at least two arms, whose end regions approach the platelike element.

22. Arrangement according to claim 1, wherein a magnet is so movably mounted that by interaction with the operating element it is movable into its operating position and after removing the operating element is movable into a waiting position, the holding for the magnet on passing from the waiting position into the operating position operates a galvanic switch.

23. Arrangement according to claim 1, further comprising an automatic disconnecting device for automatically switching off the device for determining position.

24. Arrangement according to claim 1, further comprising a master switch for switching the device on and off for determining the position.

* * * * *